(12) United States Patent
Higgins et al.

(10) Patent No.: US 11,029,369 B1
(45) Date of Patent: Jun. 8, 2021

(54) SELF-LEVELING MAGNETIC SOURCE (71) Applicant: ALKEN Inc., Colchester, VT (US)

(72) Inventors: Robert F. Higgins, South Burlington, VT (US); Allan G. Rodgers, Jr., Waterbury, VT (US)

(73) Assignee: ALKEN Inc., Colchester, VT (US)

( * ) Notice: Subject to any disclaimer, the term of this patent is extended or adjusted under 35 U.S.C. 154(b) by 0 days.

(21) Appl. No.: 16/773,370

(22) Filed: Jan. 27, 2020

Related U.S. Application Data (60) Provisional application No. 62/797,254, filed on Jan. 26, 2019.

(51) Int. Cl.
 *G01R 33/00* (2006.01)
 *G01B 7/00* (2006.01)
 *G01P 13/00* (2006.01)
 *G01P 15/08* (2006.01)

(52) U.S. Cl.
 CPC .......... *G01R 33/0017* (2013.01); *G01B 7/003* (2013.01); *G01P 13/00* (2013.01); *G01P 15/08* (2013.01)

(58) Field of Classification Search
 CPC .......... G01B 7/003; G01P 13/00; G01P 15/08
 See application file for complete search history.

(56) References Cited

U.S. PATENT DOCUMENTS

| | | | | |
|---|---|---|---|---|
| 2009/0076746 | A1* | 3/2009 | Higgins | A61B 5/06 702/57 |
| 2010/0102980 | A1* | 4/2010 | Troy | G05B 19/042 340/686.6 |
| 2019/0353745 | A1* | 11/2019 | Zur | G01S 17/875 |

* cited by examiner

*Primary Examiner* — Alvaro E Fortich
(74) *Attorney, Agent, or Firm* — Lerner, David, Littenberg, Krumholz & Mentlik, LLP (57) ABSTRACT

A method for calibrating a magnetic source of an electromagnetic tracking system for tracking a position and orientation of an object using an inertial motion unit (IMU) mounted to the magnetic source and aligned with the coil array of magnetic source. Pitch and rolls angles of the coil array are calibrated using the IMU.

16 Claims, 6 Drawing Sheets

SELF-LEVELING MAGNETIC SOURCE

CROSS-REFERENCE TO RELATED APPLICATIONS

The present application claims the benefit of the filing date of U.S. Provisional Patent Application No. 62/797,254 filed Jan. 26, 2019, the disclosure of which is hereby incorporated herein by reference.

TECHNICAL FIELD

The present disclosure generally relates to electromagnetic tracking systems.

BACKGROUND

Electromagnetic tracking systems use electromagnetic field emitters and sensors to determine position and/or orientation (PnO) of a tracked object. In hybrid tracking systems, other technologies such as gyroscopes, accelerometers, magnetometers, barometers and others, can be combined with the electromagnetic sensors in order to improve the PnO determinations. The electromagnetic and other sensors communicate signals to a processing device included in the system electronics.

Typically, the emitters are positioned in a fixed location having a known reference frame. In a standard six degree of freedom (6-DOF) electromagnetic tracking system, the known location may include each of three defined spatial axes, such as orthogonal X, Y, and Z axes, as well as three defined rotational axes, such as roll, pitch and azimuth axes, whereby roll is defined as a rotation about the X axis, pitch is defined as rotation about the Y axis, and azimuth is defined as a rotation about the Z axis. The PnO of the sensors, are then calculated relative to the known reference frame. In the 6-DOF system, the PnO may include X, Y and Z axis displacements between the magnetic source (e.g., emitters) and sensors, as well as rotational differences in each of the roll, pitch and azimuth angles of rotation.

Tracking a PnO of the sensors relative to the known reference frame may be useful for tracking interactions between a first object on which the sensors are mounted and a second object having a fixed position and orientation in the known reference frame. For example, during a simulation of operating a surgical device, it may be necessary to track the surgical device relative to an object of the simulated operation. For further example, it may be necessary to track a handheld or wearable sensor in a virtual reality environment, relative to a display positioned in the known reference frame, or both.

Signals generated by the sensor of the electromagnetic tracking system indicate a PnO of a sensor relative to a reference frame of the source. However, determining a PnO of the sensor relative to the fixed reference frame assumes that the source has been accurately and properly aligned with the fixed reference frame. Proper alignment of the magnetic source with the fixed reference frame is relatively easy along the azimuth axis, and there are many known ways of performing such an alignment. However, aligning the roll and pitch axes of the magnetic source with the defined roll and pitch axes of the fixed reference frame tends to be a more difficult task. One approach to do this is by incorporating an exact mechanical fixture. However, an exact mechanical fixture is typically expensive and time consuming, and it is not always convenient or possible to use one.

SUMMARY

One aspect of the disclosure is directed to a method for calibrating a transmitter circuit of an electromagnetic tracking system for tracking a position and orientation of a first object relative to a second object. The transmitter circuit includes a plurality of transmitter coils aligned at different transmitter axes and an actuating circuit configured to actuate the transmitter coils to generate a time-multiplexed or frequency-multiplexed magnetic field, and a receiver circuit including a plurality of sensing elements aligned at different receiver axes may be mounted to the first object. The sensing elements are configured to detect respective components of the magnetic field generated by the plurality of transmitter coils. The method may include aligning an azimuth angle of the transmitter circuit to a reference point so that an azimuth angle of an inertial motion unit (IMU) mounted to the transmitter circuit is aligned within a reference frame of the second object, whereby each of a pitch angle offset and a roll angle offset of the IMU relative to a gravitational force is adjusted so that a reference frame of the IMU is aligned with a reference frame of the transmitter circuit, and mounting the transmitter circuit to the second object while the azimuth angle of the IMU is aligned within the reference frame of the second object.

In some examples, the adjustment of each of the pitch angle offset and the roll angle offset of the IMU may include a mechanical adjustment of the IMU such that the reference frame of the IMU is physically aligned with the reference frame of the transmitter circuit.

In some examples, the adjustment of each of the pitch angle offset and the roll angle offset of the IMU may include an adjustment to calibration data stored in the electromagnetic tracking system to counteract the pitch angle offset and the roll angle offset.

In some examples, the method may include, after mounting the transmitter circuit to the second object, measuring, by the IMU, each of a pitch angle offset and a roll angle offset of the IMU relative to a gravitational force, receiving, by one or more processors of the electromagnetic tracking system, the pitch angle offset and the roll angle offset from the transmitter circuit, the transmitted pitch angle offset and roll angle offset being indicative of an offset between the reference frame of the transmitter circuit and the reference frame of the second object; and storing, by one or more processors, an indication of the pitch angle offset and the roll angle offset of the IMU in a memory of the electromagnetic tracking system. In some examples, the method may further include determining, by the one or more processors, the position and orientation of the first object relative to the second object based on an analysis of the respective components of the magnetic field detected by the plurality of receiver coils. The analysis may be calibrated according to the stored indication of the pitch angle offset and roll angle offset.

In some examples, the first object may be enclosed in an interior space of the second object and capable of moving within the interior space of the second object, and the transmitter circuit may be mounted to the second object within the interior space of the second object. For instance, the second object may be a vehicle, and the first object may be a head mounted display. In other examples, each of the first object and the second object may be positioned in a common space, the second object may be in a fixed position within the common space, and the first object may be capable of moving within the common space. For instance, the second object may be a platform or a tripod, and the first object may be a handheld object or a wearable.

Another aspect of the preset disclosure is directed to a method for calibrating an orientation of a first element of an electromagnetic tracking system pair for tracking a position and orientation of a second element of the electromagnetic tracking system pair. The first element includes a plurality of magnetic field sensing or transmitting elements adapted to sense or transmit magnetic field components along three mutually orthogonal magnetic field axes in a first frame of reference, and an inertial motion unit (IMU) adapted to detect at least one of linear acceleration or angular rotation along first, second and third IMU axes in a second frame of reference. The second frame of reference has a known orientation relative to the first frame of reference. The method may include: affixing the second element of the electromagnetic tracking system pair to a base having a fixed orientation in a third frame of reference while the base has a known orientation relative to a gravitational force, such that that a first IMU axis is aligned with a reference point of the third frame of reference within a plane having a known angle relative to the gravitational force, measuring, by the inertial motion unit (IMU) while the second element of the electromagnetic tracking system pair is affixed to the base, the gravitational force along the second and third IMU axes, and based at least in part on the measured gravitational force along the second and third IMU axes, performing at least one of determining at least part of a transform between the second frame of reference and the third frame of reference, or mechanically adjusting an orientation of the second element of the electromagnetic tracking system pair relative to the base so that the second frame of reference lies in a predetermined orientation relative to the third frame of reference of the platform, and affixing the second element of the electromagnetic tracking system pair to the base in the predetermined orientation.

In some examples, the plane may be perpendicular to the gravitational force. In some examples, the method may include determining at least part of a transform between the second frame of reference and the third frame of reference, and the transform may include each of a pitch offset angle between the second IMU axis and the plane perpendicular to the downward direction, and a roll offset angle between the third IMU axis and the plane perpendicular to the downward direction.

In some examples, the method may include determining at least part of a transform between the second frame of reference and the third frame of reference, and may further include: actuating the electromagnetic tracking system pair so that magnetic fields are transmitted by one of the first and second elements of the electromagnetic tracking system pair and sensed by the other one of the first and second elements of the electromagnetic tracking system pair, deducing a position and an orientation of the first element in the second frame of reference from magnetic fields sensed by the magnetic field sensing elements of the electromagnetic tracking system pair, and transforming the deduced position and orientation in the second frame of reference to the third frame of reference by applying the transform.

In some examples, the method may further include detecting an interaction between a first object affixed to the first element of the electromagnetic tracking system pair and a second object having a known position relative to the second element of the electromagnetic tracking system pair, based at least in part on the transformed position and orientation of the first element.

In some examples, the second element of the electromagnetic tracking system pair may be affixed to a head mounted display. In other examples, the second element of the electromagnetic tracking system pair may be affixed to a handheld object or to a wearable.

BRIEF DESCRIPTION OF THE DRAWINGS

The foregoing aspects, features and advantages of the present disclosure will be further appreciated when considered with reference to the following description of exemplary embodiments and accompanying drawings, wherein like reference numerals represent like elements. In describing the exemplary embodiments of the present disclosure illustrated in the drawings, specific terminology may be used for the sake of clarity. However, the aspects of the present disclosure are not intended to be limited to the specific terms used.

DETAILED DESCRIPTION

Figure 1:
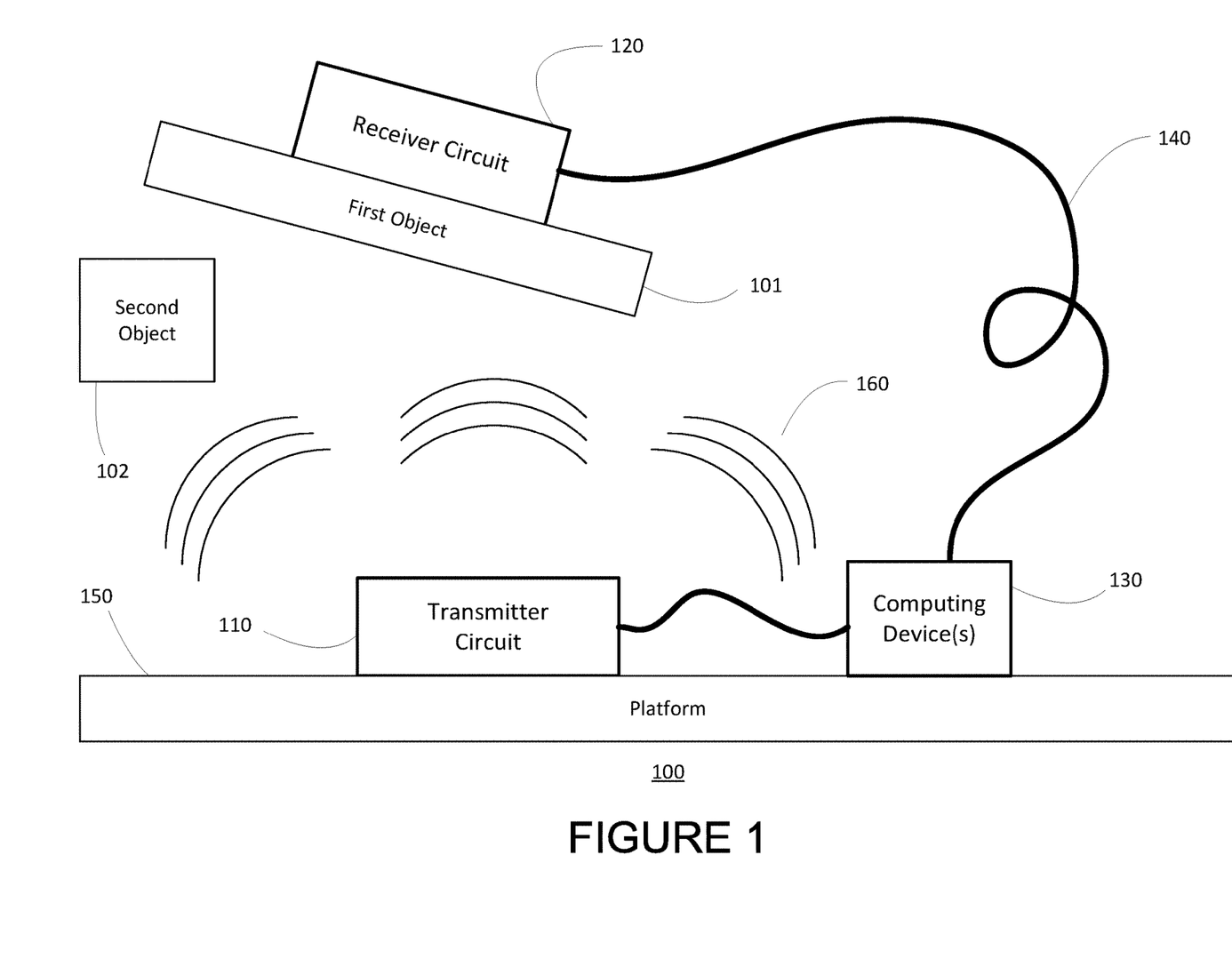
FIG. 1 is a block diagram of an electromagnetic tracking system in accordance with an embodiment of the present disclosure.

FIG. 1 is a block diagram illustrating an electromagnetic tracking system 100 for tracking a position and/or orientation (PnO) of a first object 101 relative to a second object 102. The system 100 includes a transmitter circuit 110 for generating an electromagnetic field (also referred to herein as a magnetic field), a receiver circuit 120 for sensing the generated electromagnetic field and generating electrical signals based on the sensed electromagnetic field, and one or more computing devices 130 included in the system electronics for receiving and processing the electrical signals generated by the receiver circuit 120. Each of the transmitter circuit 110 and the receiver circuit 120 may be connected to the one or more computing devices 130 in order to transmit and receive data with the computing devices 130. In the example of FIG. 1, the connections are shown as wired connections using one or more cables 140, such as USB Type-C cables or other cables typically used in electromagnetic tracking systems, or wireless connections, including short range communication protocols such as near-field communication (NFC), WiFi, Bluetooth, Bluetooth LE. Additionally or alternatively, the transmitter circuit and the receiver circuit may be connected to one another in a wired or wireless manner in order to provide information therebetween, such as providing phase information from the transmitter to the receiver to avoid phase ambiguity of the electromagnetic field generated by the transmitter.

In the example of FIG. 1, the transmitter circuit 110 is positioned on a platform 150 or base, which in practice may be a table or tripod or any other suitable surface on which the transmitter circuit 110 may be rested, mounted or otherwise positioned. Although the surface of the platform 150 is shown in FIG. 1 as being relatively level, in practice the surface may have an unknown slope within the fixed reference frame of the space, whereby positioning the transmitter circuit on the platform does not necessarily guarantee that the reference frame of the platform is perfectly in line with that of the second object 102.

The transmitter circuit 110 is shown in FIG. 1 as emitting a magnetic field 160, which in turn may be detected by the sensors of the receiver circuit 120. Further details about generation and detection of the magnetic field 160 are provided in connection with FIGS. 2-4 below.

Figure 2:
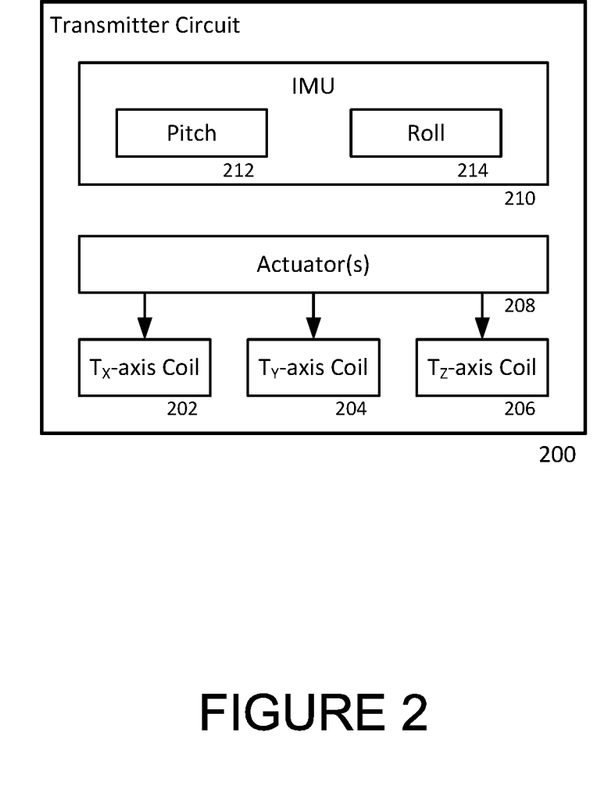
FIG. 2 is a block diagram of an example transmitter circuit that may be included in the system of FIG. 1.

FIG. 2 shows an example transmitter circuit 200 that may be used as the transmitter circuit 110 in the example system 100 of FIG. 1. In the example of FIG. 2, the transmitter circuit 200 includes a transmitter coil array having a plurality of transmitter coils 202, 204, 206 aligned along X, Y, and Z axes of the transmitter, respectively. In FIG. 2, these axes are denoted Tx, Ty and Tz. The X, Y and Z axes may be orthogonal to one another, or they may be different from one another without being orthogonal. Generally, the axes form a three-dimensional coordinate system (e.g., do not all extend within a common plane). The transmitter circuit 200 may further include an actuating circuit 108 configured to actuate the transmitter coils at different times or at different frequencies. The actuating circuit 118 may include one or more frequency generators for generating one or more alternating signals. A different frequency signal may be provided to a respective driver for driving each coil, respectively. Alternatively, the same alternating signal may be input to a multiplexer which is timed by a clock included in the transmitter, and outputs of the multiplexer may be provided to the respective drivers at different times. The drivers may further include additional components for driving the coils, such as one or more amplifier circuits. Driving the coils may result in an electromagnetic field being generated by the coils.

The transmitter circuit 200 may further include an inertial motion unit (IMU) 210. The IMU may include one or more motion tracking devices, including but not limited to any one or combination of accelerometers (such as for tracking linear acceleration), gyroscopes (such as for tracking rotation) and magnetometers (such for sensing changes to a magnetic field along a plane or within a space). IMUs typically include at least three tracking devices in order to provide coordinate motion along three axes. In one example, an IMU may include three accelerometers configured to measure linear acceleration along three axes, three gyroscope configured to measure rotational rate about the three axes, respectively, and optionally a magnetometer to track a direction of the Earth's magnetic field. The IMU axes may be orthogonal to one another, or they may be different from one another without being orthogonal. Generally, the axes form a three-dimensional coordinate system (e.g., do not all extend within a common plane). The one or more motion tracking devices may output respective sensor signals indicating the measurements, and a motion of the IMU may be determined from the signals. Inclusion of three accelerometers and three gyroscopes may enable tracking of the IMU along 6 degrees of freedom (6-DOF), including both position and orientation of the IMU.

In the example of FIG. 2, the IMU 210 may be capable of tracking at least a roll 212 and a pitch 214 of the IMU 210. The roll and pitch of the IMU may indicate how level the IMU 210 is with the ground, since an effect of the gravitational force from the Earth exerted on the IMU 210 may change as the IMU 210 is tilted. Stated another way, an output of 0.0 degrees roll and 0.0 degrees pitch from the IMU 210 may indicate that the IMU is aligned with the ground. This may also indicate that the IMU 210 is aligned with the fixed reference frame.

Figure 3:
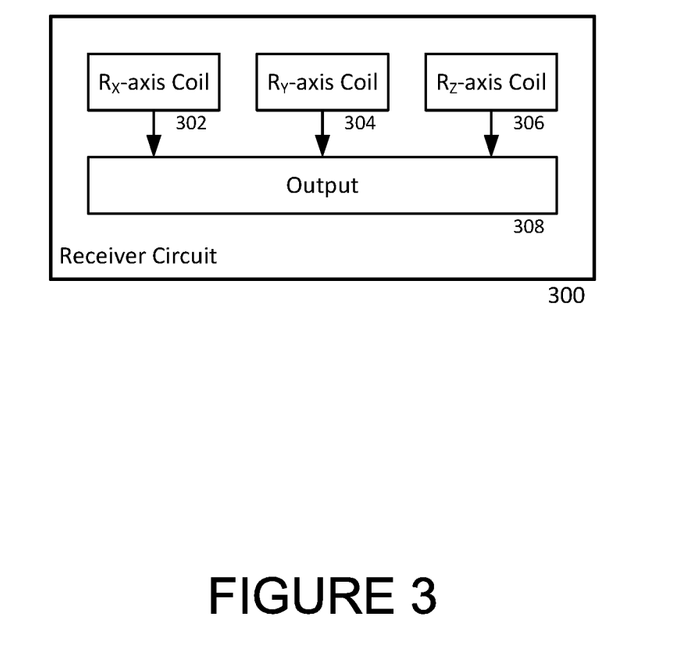
FIG. 3 is a block diagram of an example receiver circuit that may be included in the system of FIG. 1.

FIG. 3 shows an example receiver circuit 300 that may be used as the receiver circuit 120 in the example system 100 of FIG. 1. The receiver circuit 300 includes a receiver coil array having a plurality of receiver coils 302, 304, 306 aligned along X, Y, and Z axes of the receiver circuit, respectively. In FIG. 1, these axes are denoted Rx, Ry and Rz. As with the transmitter axes, the X, Y and Z axes of the receiver circuit 120 may be orthogonal to one another, or may be different from one another without being orthogonal. Generally, the axes form a three-dimensional coordinate system (e.g., do not all extend within a common plane). Since the receiver circuit and transmitter circuit are capable of being oriented independent of one another, it should be understood that the X, Y and Z axes of one circuit are not necessarily aligned with the X, Y and Z axes of the other circuit.

In operation, the electromagnetic field generated by the transmitter circuit may cause an alternating electric current to be generated in the windings of the receiver coils 302, 304, 306. In the case of a time-division based transmission, the timing of the electric currents may indicate which of the transmitter coils 202, 204, 206 generated the electromagnetic field that resulted in the electric current. In the case of a frequency-division based transmission, a frequency of the alternating electric current may indicate which of the transmitter coils 202, 204, 206 is responsible. In this fashion, each of the receiving coils in the receiving coil array may derive a set of components of the electromagnetic field, whereby each component of the set is generated by a different transmitter coil of the transmitting coil array.

The receiver circuit 300 may further include an output circuit 308 for receiving the generated electric currents and providing the currents as electrical signals to an external device, such as to the computing device(s) 130. In some examples, the receiver circuit 300 may also receive signals from the IMU 210 of the transmitter circuit 200 including the IMU data (such as roll 212 and pitch 214 data), and may provide the received IMU data to the computing device(s) 130. Alternatively, if the transmitter circuit 200 is communicatively connected to the computing device(s) 130, then the data may be transmitted directly by the transmitter circuit 200. Additionally, the tracking system 100 may include other sensors such as barometers, etc., which may be used to supplement the electromagnetic tracking signals, such as to improve an accuracy on the PnO determination. Such signals may be sent directly to the computing device(s) 130, or routed via the transmitter, receiver output, or both.

Figure 4:
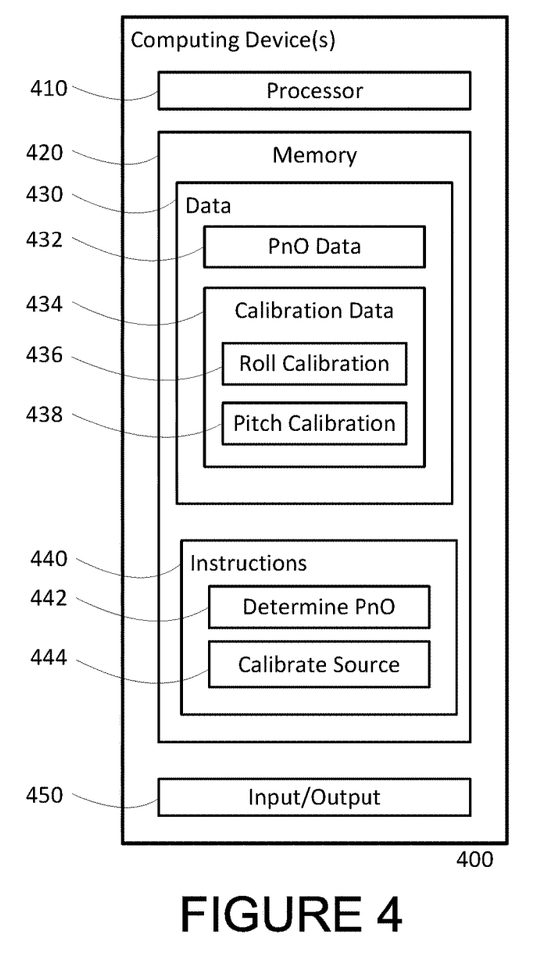
FIG. 4 is a block diagram of an example computing device that may be included in the system of FIG. 1.

FIG. 4 shows one or more example computing devices 400 that may be used as the computing device 130 in the system electronics of the example system 100 of FIG. 1. The one or more computing devices 400 of the system electronics may include a processor 410, memory 420, and other components typically present in general purpose computers. The computing devices 400 may further include one or more input/output connections 450 for sending and receiving data from the transmitter circuit, receiver circuit or both.

The processor 410 may be a well-known processor or other lesser-known types of processors. Alternatively, the processor 410 can be a dedicated controller such as an ASIC. The memory 420 can store information accessible by the processor 410, including data 430 that can be retrieved, manipulated or stored by the processor 410, in accordance with instructions 440 stored in the memory. The memory 420 may be a type of non-transitory computer readable medium capable of storing information accessible by the processor 410, such as a hard-drive, solid state drive, tape drive, optical storage, memory card, ROM, RAM, DVD, CD-ROM, write-capable, and read-only memories.

Although the system described herein is not limited by a particular data structure, the data 430 may be stored in computer registers, in a data store as a structure having a plurality of different fields and records, or documents, or buffers. The data 430 may also be formatted in a computer-readable format such as, but not limited to, binary values, ASCII or Unicode. Moreover, the data 430 can include information sufficient to identify relevant information, such as numbers, descriptive text, proprietary codes, pointers, references to data stored in other memories, including other network locations, or information that is used by a function to calculate relevant data. The instructions 440 may be a set of instructions executed directly, such as machine code, or indirectly, such as scripts, by the processor 410. In this regard, the terms "instructions," "steps," "programs" and "routines" can be used interchangeably herein. The instructions 440 can be stored in object code format for direct processing by the processor 410, or other types of computer language including scripts or collections of independent source code modules that are interpreted on demand or compiled in advance.

Although FIG. 4 functionally illustrates the processor 410 and memory 420 as being within the same computing device block 400, the processor 410 and memory 420 may actually include multiple processors and memories that may or may not be stored within the same physical housing. For example, some of the data 430 and instructions 440 may be stored on a removable CD-ROM and others within a read-only computer chip. Some or all of the instructions and data can be stored in a location physically remote from, yet still accessible by, the processor 410. Similarly, the processor 410 can actually include a collection of processors, which may or may not operate in parallel.

In the example of FIG. 1, the data 430 may include PnO data 432, which is information used for determining a position and orientation (PnO) of the receiver circuit 120 relative to the transmitter circuit 110 or vice versa, information indicating the PnO of the receiver circuit 120, or both. For example, the PnO data 432 may include a signal matrix from which the PnO may be determined. The values included in the matrix may be representations of the raw magnetic field data sensed by the receiver coils 302, 304, 306 of the receiver circuit 300, including a magnitude and polarity of the magnetic field sensed from each one of the transmitter coils 202, 204, 206 of the transmitter circuit 200.

In the example of FIGS. 2 and 3, in which three transmitter coils 202, 204, 206 generate an electromagnetic field sensed by three receiver coils 302, 304, 306, the matrix may be a 3×3 matrix, whereby each component of the matrix may correspond to a different transmitter-receiver coil pair. Table 1 shows an example matrix:

TABLE 1

| $T_X R_X$ | $T_X R_Y$ | $T_X R_Z$ |
| $T_Y R_X$ | $T_Y R_Y$ | $T_Y R_Z$ |
| $T_Z R_X$ | $T_Z R_Y$ | $T_Z R_Z$ | whereby "Tx Rx" denotes a component of the electromagnetic field generated by the X-axis transmitter coil 202 and sensed by the X-axis receiver coil 302, "Tx Ry" denotes a component of the electromagnetic field generated by the X-axis transmitter coil 202 and sensed by the Y-axis receiver coil 304, and so on. In other example configurations, M transmitter coils may be used, and N receiver coils may be used, whereby N is a value of two or more and may or may not be equal to three. In such configurations, an M×N matrix may be included in the PnO data 432. It should be recognized that if M×N<6, then it may be not be possible to solve for six variables using only the matrix, such that six degrees of freedom (such as three axes of position and three axes of orientation) of the receiver circuit may not be determined based only on the matrix. In such instances, additional sensor information may be required to provide a complete PnO determination.

The data 430 may also include calibration data 434 for calibrating an orientation of the transmitter circuit, the receiver circuit, or both. As explained in greater detail below, the calibration data 434 may be received from the IMU 210 included in the transmitter circuit 200, and may be used to align a reference frame of the receiver circuit with the fixed reference frame of the environment in which the transmitter and receiver circuits are situated. As such, the calibration data may include each of a roll calibration value 436 for calibrating a roll angle of the receiver circuit with the fixed reference frame, and a pitch calibration value 438 for calibrating a pitch angle of the receiver circuit with the fixed reference frame.

The instructions 440 may include instructions for determining a position and/or orientation 442 of the receiver circuit 120 relative to the transmitter circuit 110 based on the data 430. In particular, the PnO may be determined based on both the PnO data received from the receiver circuit and the calibration data received from the transmitter circuit. In this manner, a PnO of the receiver circuit (or an object to which the receiver circuit is mounted) is determined not only relative to the transmitter circuit (or an object on which the transmitter circuit is placed or mounted), but also relative to the fixed reference frame of the space in which the receiver and transmitter circuits are situated.

In some examples, the PnO data 432 from which the PnO determination 442 is derived may be exclusively the electrical signals generated by the receiver coils 302, 304, 306. In other examples, the determination may be based on other signals received from other sensors included in the system, such as IMU data from the IMU included in the transmitter circuit, or from one or more other IMUs included in the system, or both as well as other types of sensors.

The instructions 440 may further include instructions for calibrating an orientation of the magnetic source 444. This calibration may be performed based on the calibration data 434 received from the IMU of the transmitter circuit.

Figure 5:
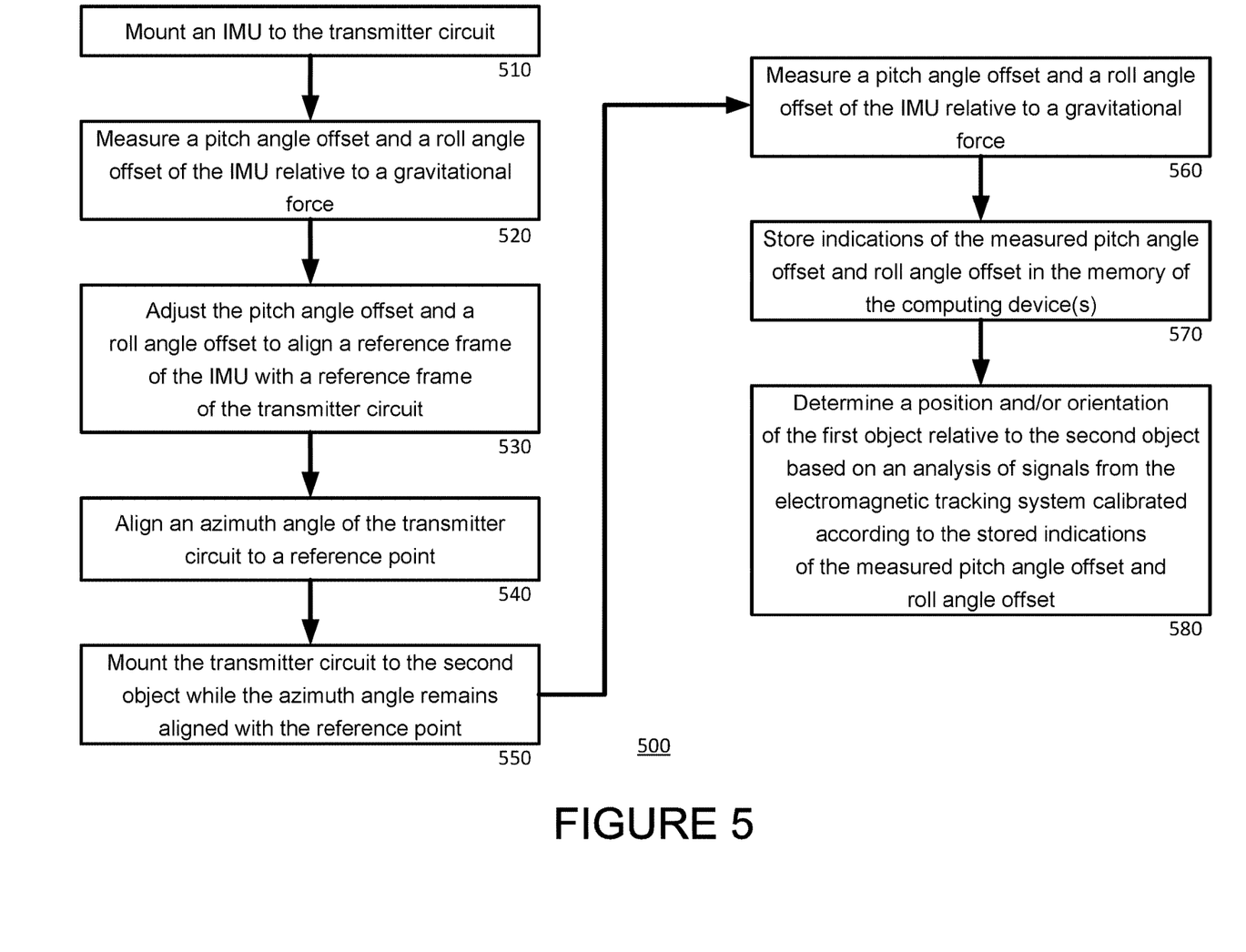
FIG. 5 is a flow diagram of an example routine in accordance with an embodiment of the present disclosure.

FIG. 5 is a flow diagram showing an example routine 500 for calibrating the transmitter circuit of the electromagnetic tracking system. At least some of the operations in the routine may be carried out by the computing device(s) of the system electronics. It should be understood that in other examples, steps may be added, subtracted, replaced or reordered in the routine 500.

At block 510, an IMU is mounted to the transmitter circuit. In some examples, the transmitter circuit may include a housing, and the IMU may be embedded within the housing. In some such examples, the IMU and transmitter coil array may share a common housing. In other examples, they may have separate housings that are affixed to one another.

At block 520, the IMU measures each of a pitch angle offset and a roll angle offset of the IMU relative to a gravitational force. This operation may be done during production of the transmitter circuit, or at a subsequent time. The measurements are preferably performed under conditions in which the Z axis of transmitter circuit is known to be aligned with a gravitational force exerted on the transmitter circuit, whereby the roll angle and pitch angle of the IMU are expected to be 0 degrees. To the extent that the roll angle and pitch angle of the IMU are different from 0 degrees, this offset may be measured. The offset thus provides an indication of a degree of tilt in the IMU relative to the ground or gravitational force and relative to the transmitter array of the transmitter circuit.

At block 530, the pitch angle offset and the roll angle offset of the IMU may be adjusted so that a reference frame of the IMU is aligned with a reference frame of the transmitter circuit. This adjustment may be performed mechanically, whereby the IMU is brought into physical alignment with the transmitter array of the transmitter circuit. Alternatively, the adjustment may be performed using software, whereby the roll angle offset and the pitch angle offset are numerical values that are stored in a data storage device in order to provide numerical correction to the measurements by the IMU based on the offsets, thereby counteracting the effect of the tilt of the IMU during manufacture of the transmitter circuit.

For example, if the offset indicates that the IMU is tilted 0.7 degrees along the roll angle axis and −1.8 degrees along the pitch angle axis, then correction values of −0.7 degrees and +1.8 degrees may be stored, respectively. Then, in a future scenario, when the IMU outputs signals indicating a measured tilt of 2.0 degrees along the roll angle axis and −0.3 degrees along the pitch angle axis, the correction values −0.7 and +1.8 may be added to the measurements, respectively, to provide adjusted values of 1.3 degrees along the roll angle and +1.5 degrees along the pitch angle that more accurately reflect the actual tilt of the transmitter coil array. The correction values may be stored in a data storage device of the transmitter circuit for subsequent transmission to the computing device(s) of the system electronics, or if the computing device is already available during this calibration step, may be programmed directly to the computing device memory. It should be understood that the correction values may be stored in any other storage device in communication with the computing device(s) during at least a setup and/or installation of the electromagnetic tracking system.

At block 540, an azimuth angle of the transmitter circuit is aligned to a reference point. This may be performed prior to or during mounting the transmitter circuit on the platform, such that when the transmitter circuit is mounted to the platform it is aligned with the fixed reference frame. Alignment of the azimuth angle may be performed by assigning a set point, and then pointing a laser from the transmitter circuit towards the set point, whereby the transmitter circuit is properly aligned when the laser shines on the set point. Other known methods for aligning an azimuth angle may be used.

At block 550, the transmitter circuit is mounted to the platform while the azimuth angle of the IMU is aligned within the fixed reference frame. At this point, the IMU, transmitter coil array, and platform are all aligned with one another in at least one axis of the fixed reference frame. In particular, the IMU and transmitter coil array are fully aligned from the calibration steps of blocks 510-530, and the transmitter circuit and platform are aligned with one another along the azimuth angle. However, it is still not known whether the transmitter circuit and platform are properly aligned along the roll and pitch axes.

At block 560, each of a pitch angle offset and a roll angle offset of the IMU relative to a gravitational force are measured. This operation may be done after mounting the transmitter circuit to the platform, whereby the roll angle and pitch angle of the IMU are expected to be 0 degrees. To the extent that the roll angle and pitch angle of the IMU are different from 0 degrees, this offset may be measured. The offset thus provides an indication of a degree of tilt in the IMU relative to the ground or gravitational force and relative to the fixed reference frame of the space in which the transmitter circuit and the tracked object are situated.

At block 570, the computing device(s) may receive the measured offsets from block 560, and may store the offsets, or indications of the measured offsets, in the memory. The indication of the offset may be a value of the offset itself, or it may be a correction value used to counteract the offset. For instance, the correction value may have the same magnitude but opposite polarity as the offset value.

At block 580, a position, orientation or both of the tracked object relative to the fixed reference frame may be determined based on an analysis of the respective components of the electromagnetic field detected by the plurality of receiver coils. The analysis may include a calibration using the stored indication of the pitch angle offset and roll angle offset. For example, if the measured offsets stored at block 570 indicate that the platform is tilted −0.5 degrees along the roll angle axis and 1.1 degrees along the pitch angle axis, then correction values of 0.5 degrees and −1.1 degrees may be applied to the determined PnO, in order to align the determined PnO with the fixed reference frame.

The above examples generally describe an IMU included in a transmitter circuit of an electromagnetic tracking system being calibrated to align with the reference frame of an external object. However, due to the reciprocal nature of electromagnetic tracking systems, an alternative configuration may involve the transmitter circuit being mounted to the tracked object and the receiver circuit being mounted to the fixed platform. In this manner, in those instances where connecting the computing device to the receiver circuit may be difficult for a receiver circuit mounted to the tracked object, the receiver circuit could be mounted to the fixed. In such instances, the IMU may be included in the receiver circuit instead of in the transmitter circuit in order to align the reference frame of the receiver circuit to the reference frame of the external object that the tracked transmitter circuit interacts with.

Figure 6:
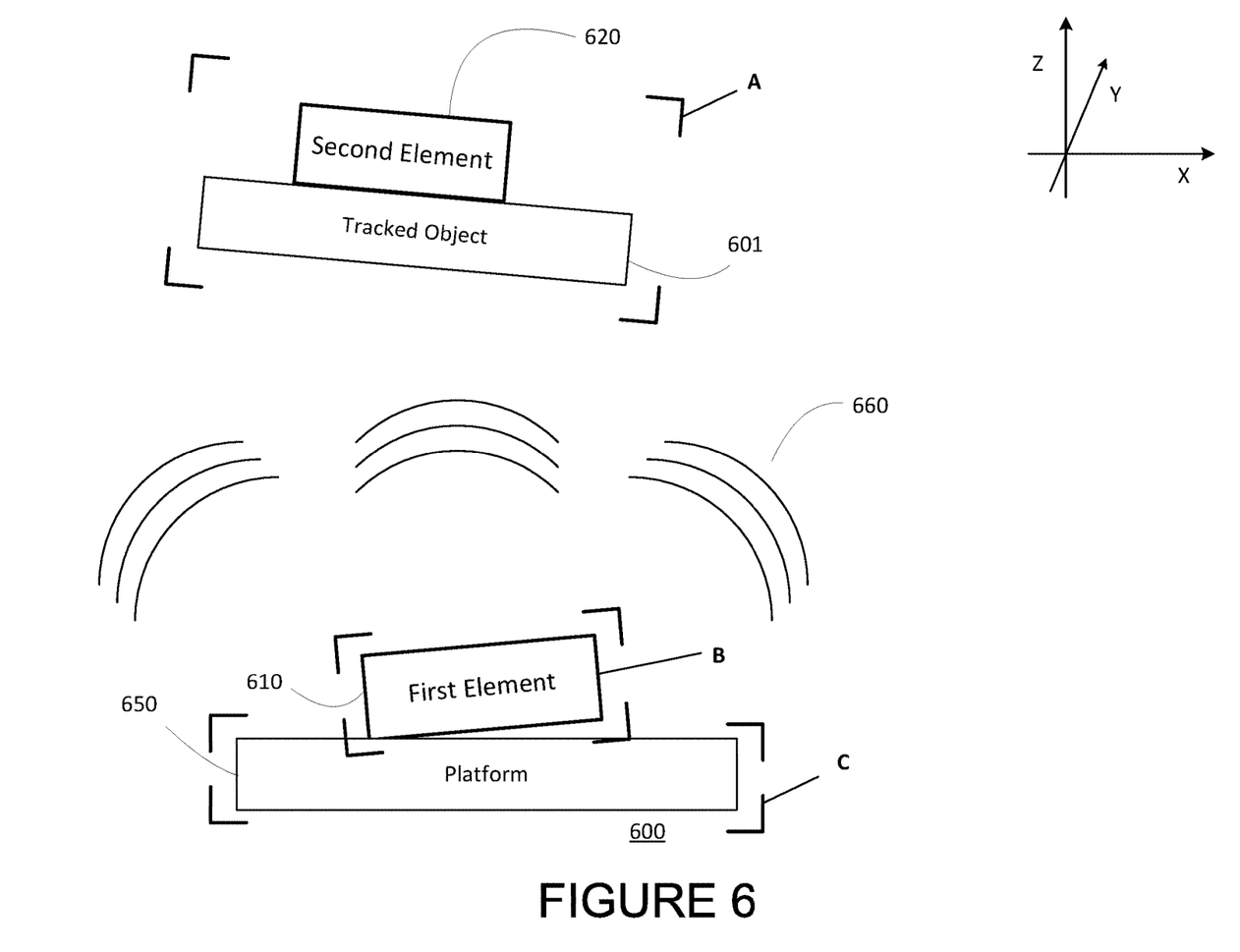
FIG. 6 is a block diagram of another electromagnetic tracking system in accordance with an embodiment of the present disclosure.

For further illustration, FIG. 6 shows a generalized example of an electromagnetic tracking system having a pair of elements, one of which elements is capable of generating an electromagnetic field, and the other of which elements is capable of sensing the electromagnetic field generated by the other element. For purposes of clarity, one element is referred to as the "first element" 610 and the other element is referred to as the "second element" 620, whereby if the first element 610 is a transmitter circuit, then the second element 620 is a receiver circuit, but if the first element 610 is a receiver circuit, then the second element 620 is a transmitter circuit.

The first element 610 is affixed to a platform 650. It should be noted that each of the first element 610, the second element 620 and the platform 650 may be considered to have their own frame of reference, shown in FIG. 6 as A for the second element, B for the first element, and C for the platform. The frame of reference of the first element (B) may be defined by an alignment of the axes of the transmitter or receiver coils in the first element. These axes may further have a known orientation relative to at least two axes of the IMU included in the first element, such as the X and Y axes in FIG. 6. The aforementioned at least two axes of the IMU may be used to detect gravitational forces along those axes, such that an orientation of the axes of the transmitter or receiver coils relative to a gravitational force may be determined based on the IMU.

The first element may be affixed to the platform such that that a third IMU axis, such as the Z axis in FIG. 6, lies in a plane at a known angle relative to the downward direction of the gravitational field, and such that the first element has a known angular position about the third IMU axis. However, an orientation of the first element relative to the platform may be unknown and thus require calibration. While in the fixed position, the IMU of the first element may measure gravitational forces along the at least two axes in order to determine a difference between the frame of reference of the first element (B) and a frame of reference of the platform (C). Based on the determined difference between these two frames of reference, the frame of reference of the first element (B) may be adjusted, either mathematically or mechanically. In the case of a mathematical adjustment, a transform between the two frames of reference may be determined. This transform may then be applied to information defined in the frame of reference of the first element (B) to convert it to the frame of reference of the platform (C). Alternatively, in the case on a mechanical adjustment, an orientation of the first element relative to the platform may be physically adjusted such that the frame of reference of the first element (B) lies in a known orientation relative to the frame of reference of the platform (C), and the first element is affixed to the platform in that known orientation.

In operation, the calibrated first element 610 may perform frame of reference transforms between the tracked second element 620, or a tracked object 601 affixed thereto. The tracked object 601 may move and rotate, and thus defines its own frame of reference A. The generated and sensed magnetic field of the electromagnetic tracking system pair may be used to track changes to a transform between the frame of reference of the first element (B) and the frame of reference of the second element and tracked object (C). Further, using the transform between the frames of reference of the first element (B) and the second element (A), a transform between the frames of reference of the tracked object (A) and the platform (C) can be deduced.

As noted in the previous examples, the platform 650 may share its frame of reference (A) with one or more additional objects, such as second object 102 in FIG. 1, but not shown in FIG. 6. In such a case, deducing a transform between the A and C frames of reference may in turn be useful for tracking movement of the tracked object within the frame of reference A relative to the second object within the frame of reference C.

The above examples generally describe calibration techniques involving an IMU mounted to a transmitter circuit of an electromagnetic tracking system. It should be understood that the term "IMU" is contemplated to refer to one or more motion tracking devices, whereby the "IMU" described herein may be thought of as one or more IMUs.

The above examples generally describe a receiver circuit that includes coils in order to detect the magnetic field generated by the transmitter circuit. However, in other examples, the receiver circuit may include sensing elements other than coils. For example, the receiver circuit may include one or more Hall effect sensing elements. It should be understood that the receiver coils of any of the above examples and embodiments may be replaced with the alternative receiver elements without changing the underlying nature of the systems and methods.

The above examples describe calibrating roll and pitch angles of the IMU relative to the transmitter circuit. It should also be understood that an azimuth angle of the IMU may be calibrated relative to the reference frame of the transmitter circuit, such as by using the calibration technique described in connection with block 540 of routine 500, or any other technique known in the art. Calibrating the azimuth angle of the IMU may be beneficial for an electromagnetic system that relies on IMU data to determine a PnO of a tracked object, such as a system that supplements the electrical signals generated by the receiver coil array from the sensed magnetic field with data from other sensors and motion trackers in order to improve an accuracy of the PnO determination. Knowing the correct orientation of the azimuth angle of the IMU can help to align the IMU data with the electromagnetic tracking data in the azimuth axis.

The example electromagnetic tracking devices, systems and methods described above may be useful in several applications, including head mounted displays (HMD), surgical navigation (including simulations of surgical procedures), virtual reality or augmented reality programs, and more. Generally, the receiver circuit is mounted to a tracked object. The tracked object may be a wearable or handheld object operated by a user, such as a helmet, a handheld surgical device, or a stylus. The tracked object may further interact with another interactive object, such as a display at which the tracked object is pointed, or a training subject other sort of object through which the tracked object is navigated. In order to track the tracked object, the transmitter circuit may be mounted to a fixed platform, such as a tripod or surface, in applications for which the user is not travelling. The transmitter circuit may be mounted to a frame of a vehicle of the user for applications in which the user is travelling, whereby the tracked object may interact with an interactive object within the frame of reference of the moving vehicle. In any of the above described instances, calibration the transmitter circuit may permit for the transmitter circuit to align with the reference frame of the interactive object, whereby tracking the tracked object indicates not only a position and orientation of the tracked object in relation to the transmitter and platform, but also in relation to the interactive object.

Although the present disclosure herein has been described with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A method for calibrating a transmitter circuit of an electromagnetic tracking system for tracking a position and orientation of a first object relative to a second object, wherein the transmitter circuit includes a plurality of transmitter coils aligned at different transmitter axes and an actuating circuit configured to actuate the transmitter coils to generate a time-multiplexed or frequency-multiplexed magnetic field, wherein a receiver circuit including a plurality of sensing elements aligned at different receiver axes is mounted to the first object, and wherein the sensing elements are configured to detect respective components of the magnetic field generated by the plurality of transmitter coils, the method comprising:

aligning an azimuth angle of the transmitter circuit to a reference point so that an azimuth angle of an inertial motion unit (IMU) mounted to the transmitter circuit is aligned within a reference frame of the second object, wherein each of a pitch angle offset and a roll angle offset of the IMU relative to a gravitational force is adjusted so that a reference frame of the IMU is aligned with a reference frame of the transmitter circuit; and mounting the transmitter circuit to the second object while the azimuth angle of the IMU is aligned within the reference frame of the second object.

2. The method according to claim 1, wherein the adjustment of each of the pitch angle offset and the roll angle offset of the IMU comprises a mechanical adjustment of the IMU such that the reference frame of the IMU is physically aligned with the reference frame of the transmitter circuit.

3. The method according to claim 1, wherein the adjustment of each of the pitch angle offset and the roll angle offset of the IMU comprises an adjustment to calibration data stored in the electromagnetic tracking system to counteract the pitch angle offset and the roll angle offset.

4. The method according to claim 1, further comprising, after mounting the transmitter circuit to the second object:
measuring, by the IMU, each of the pitch angle offset and the roll angle offset of the IMU relative to the gravitational force; and receiving, by one or more processors of the electromagnetic tracking system, the pitch angle offset and the roll angle offset from the transmitter circuit, wherein the transmitted pitch angle offset and roll angle offset are indicative of an offset between the reference frame of the transmitter circuit and the reference frame of the second object; and storing, by one or more processors, an indication of the pitch angle offset and the roll angle offset of the IMU in a memory of the electromagnetic tracking system.

5. The method according to claim 4, further comprising:
determining, by the one or more processors, the position and orientation of the first object relative to the second object based on an analysis of the respective components of the magnetic field detected by the plurality of receiver coils, wherein the analysis is calibrated according to the stored indication of the pitch angle offset and roll angle offset.

6. The method according to claim 1, wherein the first object is enclosed in an interior space of the second object and capable of moving within the interior space of the second object, and wherein the transmitter circuit is mounted to the second object within the interior space of the second object.

7. The method according to claim 6, wherein the second object is a vehicle, and wherein the first object is a head mounted display.

8. The method according to claim 1, wherein each of the first object and the second object are positioned in a common space, wherein the second object is in a fixed position within the common space, and wherein the first object is capable of moving within the common space.

9. The method according to claim 8, wherein the second object is a platform or a tripod, and wherein the first object is a handheld object or a wearable.

10. A method for calibrating an orientation of a first element of an electromagnetic tracking system pair for tracking a position and orientation of a second element of the electromagnetic tracking system pair, wherein the first element includes a plurality of magnetic field sensing or transmitting elements adapted to sense or transmit magnetic field components along three mutually orthogonal magnetic field axes in a first frame of reference, and an inertial motion unit (IMU) adapted to detect at least one of linear acceleration or angular rotation along first, second and third IMU axes in a second frame of reference, the second frame of reference having a known orientation relative to the first frame of reference, the method comprising:
affixing the second element of the electromagnetic tracking system pair to a base having a fixed orientation in a third frame of reference while the base has a known orientation relative to a gravitational force, such that that a first IMU axis is aligned with a reference point of the third frame of reference within a plane having a known angle relative to the gravitational force;

while the second element of the electromagnetic tracking system pair is affixed to the base, measuring, by the inertial motion unit (IMU), the gravitational force along the second and third IMU axes; and based at least in part on the measured gravitational force along the second and third IMU axes, performing at least one of:
determining at least part of a transform between the second frame of reference and the third frame of reference; or mechanically adjusting an orientation of the second element of the electromagnetic tracking system pair relative to the base so that the second frame of reference lies in a predetermined orientation relative to the third frame of reference of the platform, and affixing the second element of the electromagnetic tracking system pair to the base in the predetermined orientation.

11. The method according to claim 10, wherein, while the plane is perpendicular to the gravitational force.

12. The method according to claim 11, wherein the method includes determining at least part of the transform between the second frame of reference and the third frame of reference, and the transform includes:
a pitch off set angle between the second IMU axis and the plane perpendicular to the downward direction; and
a roll offset angle between the third IMU axis and the plane perpendicular to the downward direction.

13. The method according to claim 10, wherein the method includes determining at least part of the transform between the second frame of reference and the third frame of reference, and further comprises:
actuating the electromagnetic tracking system pair so that magnetic fields are transmitted by one of the first and second elements of the electromagnetic tracking system pair and sensed by the other one of the first and second elements of the electromagnetic tracking system pair;

deducing a position and an orientation of the first element in the second frame of reference from magnetic fields sensed by the magnetic field sensing elements of the electromagnetic tracking system pair; and transforming the deduced position and orientation in the second frame of reference to the third frame of reference by applying the transform.

14. The method according to claim 13, wherein the method further comprises detecting an interaction between a first object affixed to the first element of the electromagnetic tracking system pair and a second object having a known position relative to the second element of the electromagnetic tracking system pair, based at least in part on the transformed position and orientation of the first element.

15. The method according to claim 10, wherein the second element of the electromagnetic tracking system pair is affixed to a head mounted display.

16. The method according to claim 10, wherein the second element of the electromagnetic tracking system pair is affixed to a handheld object or to a wearable.

* * * * *

UNITED STATES PATENT AND TRADEMARK OFFICE
CERTIFICATE OF CORRECTION

| | |
|---|---|
| PATENT NO. | : 11,029,369 B1 |
| APPLICATION NO. | : 16/773370 |
| DATED | : June 8, 2021 |
| INVENTOR(S) | : Robert F. Higgins and Allan G. Rodgers, Jr. |

Page 1 of 1

It is certified that error appears in the above-identified patent and that said Letters Patent is hereby corrected as shown below:

On the Title Page

Column 1, Item (71) Applicant: after "Inc.," insert -- dba Polhemus --.

Column 1, Item (73) Assignee: after "Inc.," insert -- dba Polhemus --.

Signed and Sealed this
Seventh Day of September, 2021

Drew Hirshfeld
*Performing the Functions and Duties of the
Under Secretary of Commerce for Intellectual Property and
Director of the United States Patent and Trademark Office*